(12) United States Patent
Reynolds et al.

(10) Patent No.: US 7,105,385 B2
(45) Date of Patent: Sep. 12, 2006

(54) FPGA BLOCKS WITH ADJUSTABLE POROSITY PASS THRU

(75) Inventors: Christopher B. Reynolds, Underhill, VT (US); Sebastian T. Ventrone, South Burlington, VT (US); Angela Weil, Woodbridge, VA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/731,296

(22) Filed: Dec. 9, 2003

(65) Prior Publication Data
US 2005/0121698 A1 Jun. 9, 2005

(51) Int. Cl.
H01L 21/82 (2006.01)
H01L 21/3205 (2006.01)
H01L 21/44 (2006.01)
G06F 9/45 (2006.01)

(52) U.S. Cl. .................. 438/128; 438/129; 438/587; 438/598; 716/7

(58) Field of Classification Search ............... 257/208, 257/210, 211, 202, 207; 438/128, 129, 587, 438/598; 716/7
See application file for complete search history.

(56) References Cited

U.S. PATENT DOCUMENTS 5,990,502 A 11/1999 Park

2003/0023937 A1 1/2003 McManus et al.

FOREIGN PATENT DOCUMENTS

EP 0271596 A1 6/1988
EP 0782188 A2 7/1997

Primary Examiner—Steven Loke
(74) Attorney, Agent, or Firm—James A. Lucas; Driggs, Hogg & Fry Co., Ltd.

(57) ABSTRACT

A field programmable gate array is described for use in a semiconductor chip such as a VLSI chip. The array is provided with variable wire-through porosity to allow for optimum chip-level routing through the array. This is achieved by dividing the array into blocks which can be individually assessed for required porosity. Then blocks that have been prefabricated with differing porosities are placed in the macro to optimize local chip level routing. The routing of wires is determined by developing a chip floor plan to include early timing allocation and a proposed placement of the array. The floor plan is then overlaid with critical logical wiring nets. From this, an initial selection of blocks is made based on proposed wiring density, and the macro is assembled with the blocks strategically placed therein. The procedure is likewise applicable to other types of densely obstructed cores embedded with a chip.

5 Claims, 3 Drawing Sheets

FPGA BLOCKS WITH ADJUSTABLE POROSITY PASS THRU

FIELD OF THE INVENTION

This invention relates to the field gate array programming facility capable of efficiently and independently accessing logical blocks of physically local, as well as remotely distributed data, and to the method of making the same.

BACKGROUND OF THE INVENTION

For the last past two decades, integrated circuits have been composed of logical and physical units made of gating elements and wiring elements to interconnect the logic. There has been a trend toward larger stand-alone functional units called macros. These macros use a substantial silicon area on a semiconductor chip. One of the newer units is an embedded field programmable gate array (FPGA) macro. These macros use up a large area of a chip and a significant portion of the wiring channels that pass through the chip. This factor creates an inability to wire through the chip in the area of the macro.

Currently, FPGAs are becoming an accepted component embedded within standard chip designs along with semi-custom cores and memory macros. Standard block design is a term that is used to describe NANDS, NORS and other types of individual books that comprise a logic family. The books are designed with standard block implementation with simple books, such as an inverter taking one block and more complex books taking several blocks. Technology has now migrated to less than 100 nm ground rules, or restrictions on how shapes can be laid out to enable a part to be made. Because of this trend, the performance effect due to wiring is becoming the primary factor of timing closure of the input and output signals. Depending upon the functions around the FPGA, the required porosity through the FPGA as initially designed may not match the required FPGA at a later time. These FPGAs are dense macros within the chip that require significant metal usage, often resulting in unacceptable wiring blockage such that key, timing critical wires must be routed around the macro, resulting in unacceptable timing delays. Accordingly, procedures for reducing or eliminating such timing delays are needed.

FPGAs are structures that are made up of collections of uniform slices. Each slice can be programmed for a segment of the total user function. In the previous implementations, FPGAs were often large dedicated chips. The current trend is to integrate these macros onto designs with other logic. As circuit density reaches 90 nm and less, the effective number of logic functions that can be integrated onto the chip is large enough to desire these FPGAs to be distributed throughout the design. Due to the significant usage of metal layers in FPGA circuitry, channels are blocked when the arrays are embedded in the chip. As a result, wires that need to travel from a circuit on one side of the FPGA to the other side within the chip will need to be routed around the FPGA. This can cause unacceptably long signal delays impacting overall chip performance and reliability because of the longer circuit paths. With current construction techniques, the embedded FPG arrays or other cores are fully obstructed on all layers. Because of the high blockage, or low porosity, power buses typically have only one contact with individual devices, resulting in relatively high effective resistance. One solution would be to place uniform wiring channels at regular intervals through an FPGA during the macro's design but, depending upon the usage, there may be either too many wiring channels or not enough. This is an inefficient use of the channels.

In Research Disclosure n337 05-92, dated May 1992, entitled "Adjustable Wiring Porosity in Flexible Gate array Design", J A Iadanza et al describe the adding of variable wire-through capability to a standard circuit or array design program to provide versatility to optimize use of first and second level wiring in a design. The capability allows minimization of space required for wiring in a wide range of array size and word dimensions. They go on to state that, in conventional engineering design system (EDS) programs, a fixed wiring porosity, e.g. 50%, has been used for first and second level wiring through macro-circuit elements from which large-scale circuit arrays are laid out (grown). By adding key words to the EDS program for porosity control for both first and second level wiring to those describing the number of words and bits per word, more efficient use of semiconductor area is achieved. Limits to array or word dimensions caused previously by fixed porosity are also eliminated. Thus, what they are achieving is the creation of a plurality of units having a variety of different PF factors. In this manner, the units can be interchanged to meet global wiring concerns without adversely impacting function performance.

SUMMARY OF THE INVENTION

One objective of the present invention is to provide a procedure for allowing adjustable porosity in a slice or slices of an embedded FPGA or other array.

Another objective is to provide a procedure that can be implemented as a stand alone method or as part of a timing/placement/wiring/timing closure methodology.

Still another objective is to provide a gate array architecture with a higher wiring density.

These and other advantages and objectives, that will become self evident upon a full comprehension of the contents hereof, are achieved in a semiconductor chip containing an embedded macro. The macro comprises a plurality of slices wherein each slice has its own porosity factor representing the number of open channels extending through the core of the macro. Each channel contains a circuit wire passing through the slice for the delivery of signals within the chip. The embedded macro is a densely obstructed macro having field programmability. Typically, the functionality of the slices in the macro is not the same. The porosity of each slice is independent of the functionality of the component blocks within the slice. The height of the blocks in a horizontal slice is generally the same, as is the width of blocks within a vertical slice. Each slice within the macro corresponds to a timing allocation in the semiconductor chip.

The invention also relates to a method for improving the routing of signals through a gate array macro embedded in a semiconductor chip by exercising adjustable porosity options within the macro. The macro is composed of a plurality of slices having different porosities depending on the number of channels extending therethrough. The method comprises the following steps. A chip floor plan is developed including early timing allocation and proposed gate array placement. This step can include establishing a base level of porosity in the chip. Then, critical logical wiring nets are flagged and the floor plan is overlaid with the nets. An initial selection of slices for the macro is made based upon the requisite number of channels required at each location within the macro. The macro is assembled with functional blocks placed within the slices of the macro, with the porosities adjusted in each slice based upon the channel requirements. If further adjustments in porosity are required after floor planning, additional slices can be changed during the execution phase of chip design prior to chip construction.

The invention also relates to a macro for use as a field programmable gate array embedded in a semiconductor chip. The macro is composed of a plurality of slices, each of which has a unique porosity factor corresponding to the number of wiring channels in the slice. The slices are composed of a plurality of functional blocks. The slices are positioned at locations within the macro wherein the porosity of each slice corresponds to the number of circuit lines in the chip that are intended to pass through wiring channels at each location of the macro. Each of the slices is pre-wired before assembly into the macro. The mass of the blocks with identical functionality is the same. The width and height of the blocks are regular enough to create a normal grid of potential porosity within each slice corresponding to the number of channels across each slice.

Furthermore, the invention relates to an article of manufacture comprising a medium having a computer readable program embodied in said medium. The computer readable program, when executed on a computer, causes the computer to perform one or more of the following steps. First, the computer develops a chip floor plan including early timing allocation and proposed gate array placement. Next, critical logical wiring nets are flagged by the computer and are laid over the floor plan to determine the proposed passage of the circuit lines through the macro. Then, the computer makes an initial selection of slices for the macro based upon the required number of channels required at each location within the macro. Finally, the computer assembles the macro with the placement of blocks in porosity adjusted slices based upon the channel requirements across each slice. At one of the steps of the process, the program causes the computer to establish a base level of porosity in the chip during the step of chip floor planning. The program also causes the computer to make further changes in slices after the step of floor planning to accommodate changes in channel requirements.

The present invention relates to a method for providing variable porosity to allow more optimum chip-level routing which can be applied to embedded FPGAs or to other devices having similar physical structure with a similar tiling pattern, such as microprocessors, DRAMS and SRAMS, read only storage, programmable logic arrays and any other similarly densely obstructed cores. Each core is divided into areas (slices) which can individually be assessed for required porosity. The porosity in each area (slice) is adjusted to optimize chip-level routing locally, rather than uniformly across the core.

The invention also relates to a method for minimizing chip floor plan and timing impacts due to size growth of the FPGA. The method includes (a) assuming a fixed overall level of porosity for the whole core, and (b) allowing the 'open' wiring tracks to be shifted between the blocks as needed.

BRIEF DESCRIPTION OF THE DRAWINGS

The present invention will be described in greater detail by specific reference to the drawings in which.

DETAILED DESCRIPTION OF THE INVENTION

Figure 2:
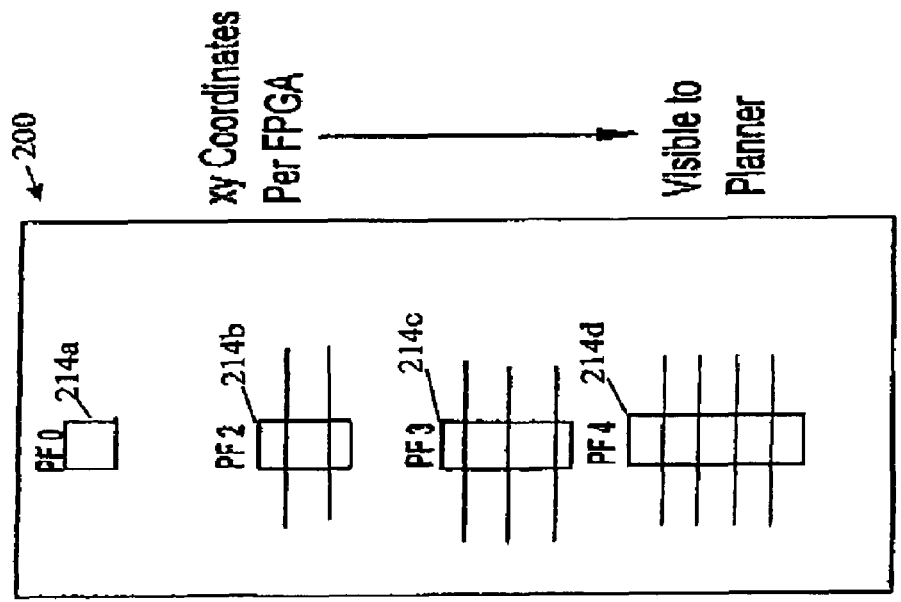
FIG. 2 is a representation of several FPGAs, each with a different porosity factor.

A VLSI chip includes a large number of electrical and logical functions, such as static and dynamic random access memory, read only storage, and programmable logic arrays. The chip is partitioned into regions that might contain different functions. The chip layout is designed to interconnect the different regions while keeping the interconnects as short as possible.

When custom designing a chip, there are certain requirements for the timing relationships between signals that go into the chip and the signals that exit the chip. Since the chip is very complex, the relationship of these I/O signals translates into a number of other requirements for the timing within the chip, and that go through circuits and that intersect certain storage elements within the chip. All of the timing requirements must be met for the chip to function properly within the system. These number in the hundreds of thousands of timing relationships that must interleave smoothly and must complement one another rather than conflict with one another.

The initial designing of a VLSI or other semiconductor chip is referred to as chip floor planning. A chip typically includes a large number of electrical and logical functions. A chip is assembled from a library of circuits. A rough outline of shapes is planned where each of the circuits will be placed. A wiring net is then used to determine the optimum paths for the signals to be transmitted through the chip. A VLSI chip comprises layers of metal stacked one on top of the other. FPGAs are very dense macros that take up the upper levels of metal where wires would normally be routed. As previously mentioned, this causes blockage so that the wires cannot pass through the macros, but instead must be bypassed around them. This can cause the length of connections to be considerably increased, accompanied by a corresponding increase in the length of time required to transmit the signals.

The present invention relates to a new structural design and methodology to efficiently use the real estate of the FPGA while still satisfying the routing of critical wires through the macro. For purposes of the discussion that follows, a slice shall mean a part of a semiconductor chip that is within, and that extends entirely through, an FPGA macro. A collection of slices will be created with each slice having its own porosity factor (PF). A porosity factor is the number of open channels available through the slice to receive wiring. Each slice with different porosity factors still executes the same function, i.e. the function of a slice PF of one is the same as that of a slice with a PF of 1000. However, the area of each slice will be dependent upon the channel count. Therefore, those slices with higher porosity or channels will have a larger area. A single FPGA macro will be made up with N numbers of these PF slices. The slices extend in both the horizontal and the vertical directions within the macro.

On the other hand, a block shall be considered a building block of the macro. These blocks are contained within the slices. The functionality and the sizes of blocks will differ.

For example, the functions of an I/O block will be different than the functions of a memory block. Blocks with the same functionality are very similar in size and in mass. The blocks in a horizontal slice will all have the same height but not necessarily the same width. Likewise, the width of the blocks within a vertical slice is all the same. The blocks may also have different sizes.

During chip floor planning early timing allocation, critical logic wiring nets will be flagged in the floor planning tool and overlaid over the planned FPGA area. Based upon the timing floor planning input, an initial PF factor selection is made per slice to create the planned FPGA made up of a variety of FPGA blocks of varying PF factors. Some area margin should still be allowed around the perimeter of the planned FPGA to allow some incremental growth.

Figure 1:
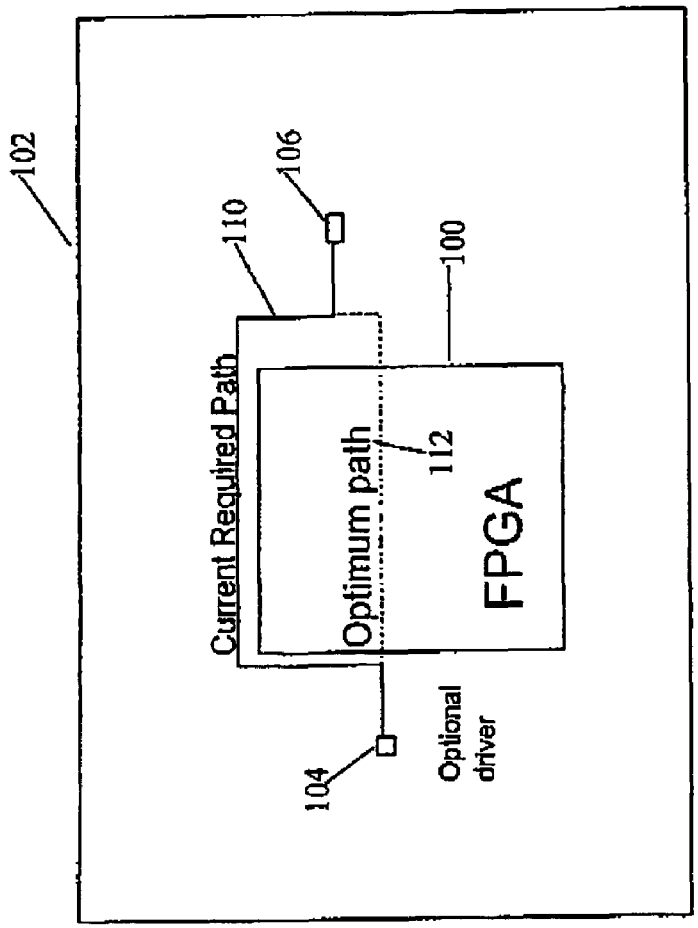
FIG. 1 represents an FPGA portraying two alternative wiring paths.

Turning now to the drawings, FIG. 1 shows an FPGA macro 100 situated within a semiconductor chip 102. As can be seen, a signal passing between the driver 104 and a destination 106 must follow a path 110 around the array 100 when the array is fully blocked. On the other hand, if the array 100 is not completely blocked, the optimum path 112 goes straight through the array, whereby the distance traveled by the signal is considerably shortened.

FIG. 2 shows a gate array macro 200 with four slices 214a through 214d, each with its own unique porosity factor. The first slice $PF_0$ 214a contains no porosity or open channels and, therefore, has the greatest density. The second slice $PF_2$ 214b contains two channels and, accordingly, is slightly larger to maintain the same mass as that of the first slice 214a. The third slice $PF_3$ 214c and the fourth slice $PF_4$ 214d contain three and four channels, respectively. Accordingly, the third slice 214c is larger than the first two slices, and the fourth slice 214d is the largest slice. In this manner, an identical mass for all four slices is maintained. It should be remembered that the FPGA macro typically contains many such slices, numbering in the hundreds.

Figure 3:
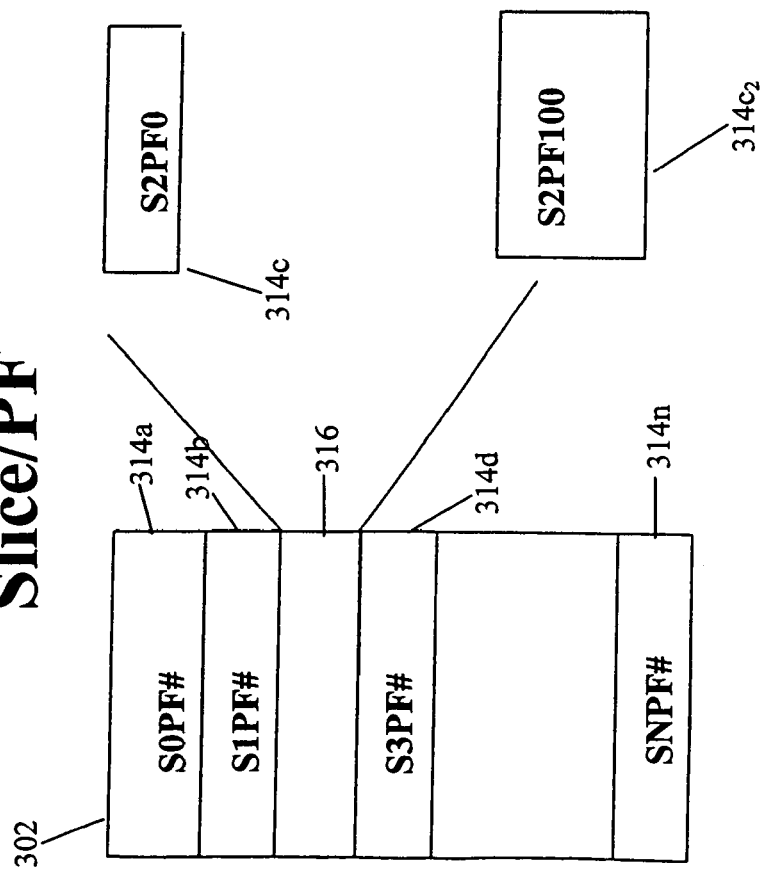
FIG. 3 shows several blocks of an array with differing porosities.

FIG. 3 shows a chip 302 containing several slices 314a to 314n. These slices are numbered $S_0$ through $S_n$, and represent portions of the chip having differing porosities. The slices can be stretched apart as required to accommodate the need for differing porosities within the slices. This is shown by the size of the empty slot 316 where a slice $314c_1$ having a zero porosity factor, or a slice $314c_2$ having a porosity factor of 100, or any other slice having the requisite porosity, can be inserted.

Figure 4:
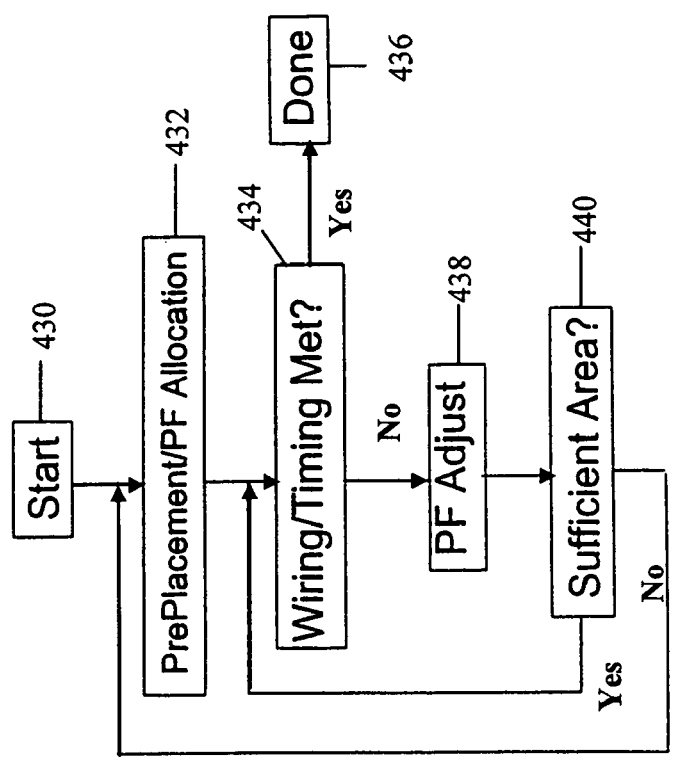
FIG. 4 is a design flow diagram useful in carrying out the present teachings.

FIG. 4 is a design flow diagram incorporating the implementation of the present invention. Starting at 430, the first step as shown at 432 is PrePlacement/PF Allocation. This initial placement/allocation goes to 434 to determine if the wiring/timing requirements have been met. If they have, then the plan is shown as done at 436. If not, the plan is routed to the PF Adjust box 438 where the existing porosity is re-apportioned and/or the overall porosity is adjusted to meet objectives. Then the adjusted plan is passed to box 440 wherein a determination is made whether sufficient area is available to accommodate the blocks. If the area is adequate, the plan is returned to box 434 to again ensure that the wiring/timing parameters have been met. If not, the plan goes to boxes 438 and 440 for additional adjustments of porosity and area. If so, the plan is flagged as completed at box 436. If it determined at 440 that there is not sufficient space on the chip to accommodate the blocks in the gate array macro, the scheme is returned to the PrePlacement/PFAllocation box 432, and the entire procedure is repeated until all of the wiring/timing/area requirements have been met.

Figure 5:
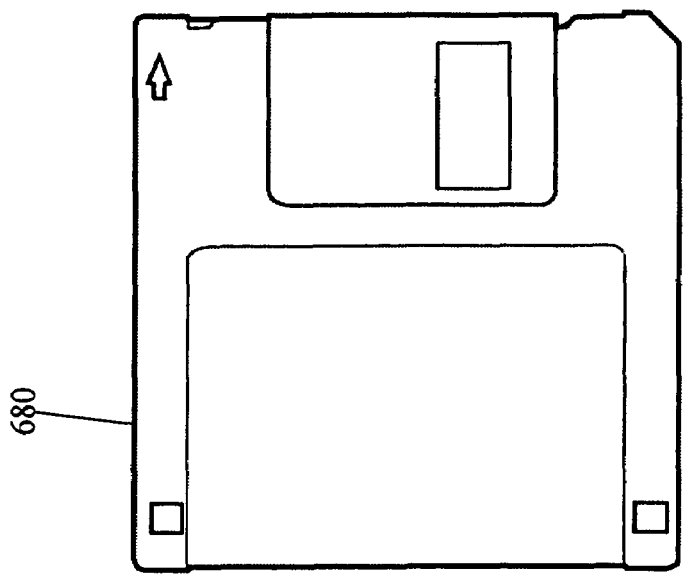
FIG. 5 is a flow sheet for porosity factor adjustment.

FIG. 5 shows a procedure for adjusting the porosity factor according to the teachings of the present invention. The chip array is shown in outline 550. A physical representation 552 of the array with PF marker layers is convened to an LEF (layout exchange format) abstract 554, or other industry accepted or proprietary floor planning abstract format, which contains the porosity factor marker layers that are in the physical representation. The output then goes to the Floorplanning PF Stretch box 560 where input from a PF Adjust Limit Table 558 is used to determine the limits on the degree or amount of stretching that is permissible. One output 570 from box 560 goes to a PF Adjusted T
able 562, the output of which goes to the GDS (graphic design system) merge tool 566 which contains a physical representation of the chip. This merge tool looks at the adjust limits from table 558 and creates the adjusted table 562 telling how much porosity to insert into each of the slices. Wires can either be drawn longer or can be augmented with spacer kernels. The spacer GDS kernels 564 are identified with an asterisk to show that their placement is an option to wire stretching. If the spacer kernels are used, they are then inserted into the plan at 566 where required to produce the final chip layout at 568.

The individual slices used in the embedded FPGA according to the present invention will have a wide range of sizes, with the slices having the greater number of channels being larger than those with fewer or no channels. Accordingly, the width of the channels passing through a larger slice may be greater than the width of corresponding channels within a smaller slice. This means that wires passing across the longer channels must be stretched or elongated so that the ends of the wires can be connected to the wires leading to and leaving the slice. This can be done by splicing an additional length of wire to the wires in the longer channels. Another method is to provide spacer tiles that can be tiled to create the stretched or lengthened wires. Each set of these spacer tiles will cover one or more channels of cross wires, with one spacer tile being placed for each block within the slice. The stretched slices are then renamed so as not to collide with other similar slices.

Figure 6:
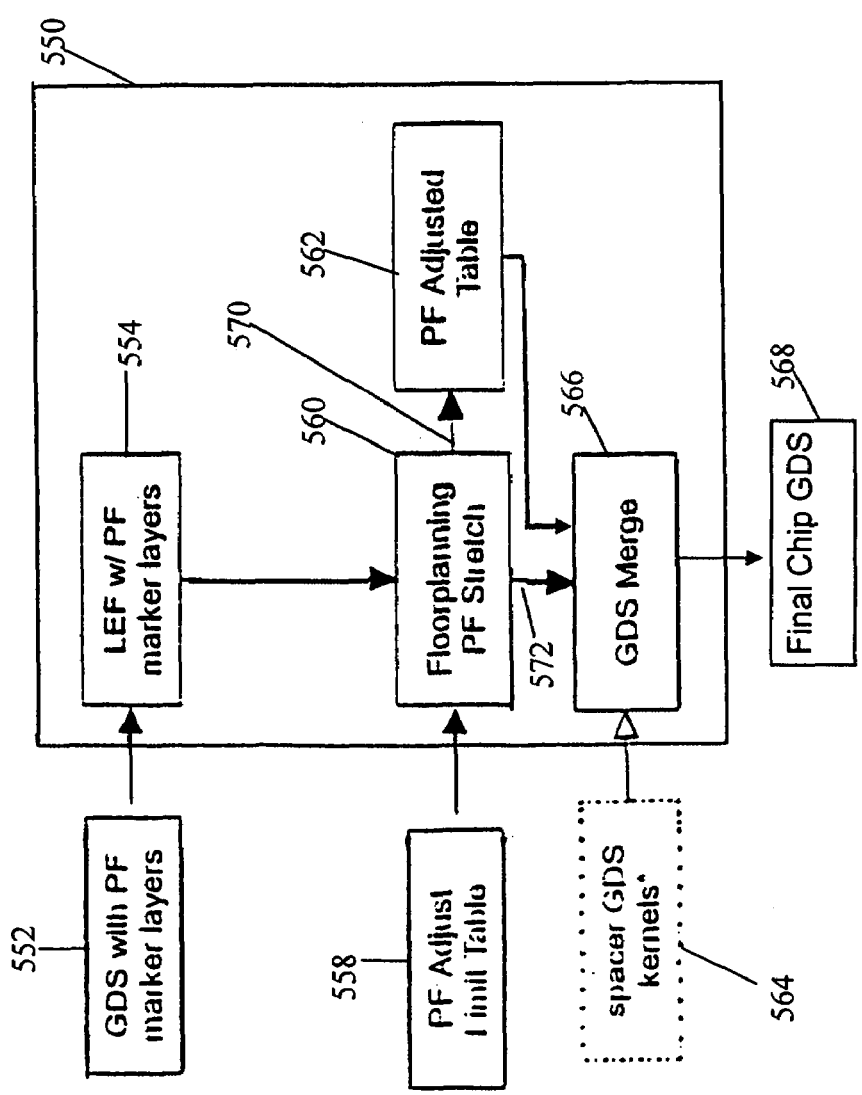
FIG. 6 represents a computer medium useful with the current invention.

FIG. 6 shows a disc 680 which is exemplary of an article of manufacture comprising a computer usable medium having a computer readable program, according to the present invention, embodied in said medium. This embodiment may be tangibly embodied in a computer program residing on a computer-readable medium or carrier. The medium may comprise one or more of a fixed and/or removable data storage device, such as a floppy disk or a CD-ROM, or it may consist of some other type of data storage or data communications device. The computer program may be loaded into the memory to configure the slices 314 of FIG. 3 for execution. It may also be used in the steps of pre-placement and allocation of porosity, determining if the wiring/timing parameters are met, reapportionment and changing the porosity, and calculating whether the area allotment is sufficient as specified in the design flow steps of FIG. 4. The computer program may also comprise instructions which perform the steps necessary to adjust the PF factor in accordance with FIG. 5.

Other machine readable storage mediums are fixed hard drives, optical discs, magnetic tapes, semiconductor memories, such as read-only memories (ROMs), programmable (PROMs), etc. The article containing this computer readable code is utilized by executing the code directly from the storage device, or by copying the code from one storage device to another storage device, or by transmitting the code on a network for remote execution.

What is claimed is:

1. A method for improving the routing of signals through an array macro embedded in a semiconductor chip wherein the macro comprises a plurality of slices, each having different porosities depending on the number of channels extending therethrough, the method comprising the steps of:
   (a) developing a chip floor plan including early timing allocation and proposed array placement;
   (b) flagging critical logical wiring nets and overlaying the floor plan with the nets;
   (c) making an initial selection of slices for the macro based upon the number of channels required at each location within the macro;
   (d) assembling the macro with the placement of slices to provide porosities based upon the channel requirements; and
   (e) changes slices after floor planning to make further adjustments in porosity.

2. The method according to claim 1 wherein the plurality of slices divide a plurality of functional blocks wherein blocks with the same functionality have the same height and width.

3. The method according to claim 1 wherein the step of chip floor planning includes establishing a base level of porosity in the chip.

4. The method according to claim 1 wherein the array comprises a field programmable gate array.

5. The method according to claim 1 wherein the changes occur during the execution phase of chip design prior to chip construction.

* * * * *